(12) United States Patent
Weber et al.

(10) Patent No.: US 8,155,903 B2
(45) Date of Patent: Apr. 10, 2012

(54) METHOD AND CIRCUIT ARRANGEMENT FOR MEASURING A CAPACITANCE

(75) Inventors: Franz-Josef Weber, Erkrath (DE); Martin Witte, Ahaus (DE)

(73) Assignee: Huf Hulsbeck & Furst GmbH & Co. KG, Velbert (DE)

( * ) Notice: Subject to any disclaimer, the term of this patent is extended or adjusted under 35 U.S.C. 154(b) by 720 days.

(21) Appl. No.: 12/297,849

(22) PCT Filed: Apr. 13, 2007

(86) PCT No.: PCT/EP2007/053655
§ 371 (c)(1),
(2), (4) Date: Oct. 20, 2008

(87) PCT Pub. No.: WO2007/122123
PCT Pub. Date: Nov. 1, 2007

(65) Prior Publication Data
US 2009/0105975 A1   Apr. 23, 2009

(30) Foreign Application Priority Data

Apr. 21, 2006   (DE) .......................... 10 2006 019 187

(51) Int. Cl.
*G01R 27/00* (2006.01)
*G06F 17/40* (2006.01)

(52) U.S. Cl. ........... 702/65; 702/186; 702/187; 702/188
(58) Field of Classification Search ............ 702/64–65, 702/117–123, 182–188; 324/76.11
See application file for complete search history.

(56) References Cited

U.S. PATENT DOCUMENTS
2004/0056643 A1   3/2004   Loef et al.

FOREIGN PATENT DOCUMENTS
DE   100 53 279 A1   5/2002

*Primary Examiner* — Phuong Huynh
(74) *Attorney, Agent, or Firm* — Fay Sharpe LLP

(57) ABSTRACT

A method of measuring a capacitance, wherein a voltage across the capacitance is supplied to an input of an evaluation circuit that is designed so that it can detect input voltages with a predetermined degree of precision so long as these voltages are in a measurement interval, includes charging the capacitance to a predetermined starting voltage which exceeds a multiple of an upper limit of the measurement interval. The capacitance across a predetermined resistance is discharged for a predetermined time period. The voltage across the capacitance reaches a final voltage value which is dependent upon the amount of the capacitance. The resistance and the time interval are so chosen that the final voltage value lies in the measurement interval. The final voltage value is detected by the evaluation circuit and the capacitance is determined from the final voltage value. A circuit arrangement for measurement of a capacitance of a capacitor is also disclosed.

15 Claims, 2 Drawing Sheets

METHOD AND CIRCUIT ARRANGEMENT FOR MEASURING A CAPACITANCE

BACKGROUND

The invention relates to a method of measuring a capacitance, wherein a voltage across the capacitance is supplied to an input of an evaluation circuit and wherein the capacitance is determined from a final voltage value which is produced after discharging of the capacitance from a predetermined starting voltage for a predetermined time period via a predetermined resistance. Furthermore, the invention relates to a circuit arrangement for measuring a capacitance using such a method.

When a capacitance (for example of a capacitor) charged to a predetermined voltage value is discharged via a resistance, then the voltage falls exponentially from the starting value according to the formula:

$$U(t) = U_0 \cdot e^{-\frac{t}{RC}},$$

where $U_0$ is the starting voltage, R is the value of the resistance and C is the capacitance (of the capacitor). If a voltage $U_{me\beta}$ were to be measured after a predetermined time interval T after the start of the discharge via the capacitor, then the capacitance could be determined from the values of $U_{me\beta}$, T, $U_0$ and R according to the formula:

$$C = \frac{T}{R} \cdot \ln \frac{U_0}{U_{me\beta}}.$$

A determination of the capacitance using this formula would be possible for example if the values of $U_0$ and R could be predetermined as exactly as possible and the most precise measurement possible of $U_{me\beta}$ could take place at a time T which is fixed as exactly as possible. However, known circuit arrangements for determining the capacitance in this way are either very complex in terms of circuitry (and expensive) or are relatively imprecise due to a large number of disruptive influences.

The requirements as to precision are lower if it is not the capacitance itself but only a relative change in the capacitance which is to be determined over a predetermined time period. In this case the precise knowledge of the values of $U_0$ and R is not necessary; these values merely have to be kept constant over the specified time period. Also the exact duration of the time period T is of lesser significance; it is merely necessary that so far as possible the same length of time passes between the start of discharging and the measurement time. In such a case all that is necessary is the most precise measurement possible of the voltage $U_{me\beta}$.

An example of application in which it is not so much the determination of the absolute capacitance but rather the determination of the relative change in capacitance which is desired, is provided by capacitive proximity sensors for detecting the proximity of an operator's body part to a door handle of a motor vehicle.

The object of the invention is to create an inexpensive and reliable possibility for capacitance measurement for a capacitive proximity sensor.

BRIEF DESCRIPTION

The invention is based upon the basic principle referred to in the introduction of determining a capacitance on the basis of a voltage measurement after a predetermined discharge time. the invention is further based upon the recognition that an evaluation circuit which detects the voltage across the capacitance does not need to measure exactly the voltages occurring across the capacitance over the entire interval, but that a voltage measurement which is the most precise possible is necessary only in a small part-interval which is designated here as a measurement interval, whereby this measurement interval is chosen so that the final voltage value, which is achieved after the discharge of the capacitance beginning with a starting voltage across a predetermined resistance for a predetermined time period in which the measurement interval must lie.

In the method according to the invention for measuring a capacitance a voltage across the capacitance is supplied to an input of an evaluation circuit, wherein the evaluation circuit is designed so that it can detect input voltages with a predetermined degree of precision so long as these voltages are in a measurement interval. The capacitance is first of all charged to a predetermined starting voltage which exceeds a multiple of an upper limit of the measurement interval. Then the capacitance across a predetermined resistance is discharged for a predetermined time period, whereby the voltage across the capacitance reaches a final voltage value which is dependent upon the amount of the capacitance, the resistance and the time interval being chosen so that the final voltage value lies in the measurement interval. Finally, the final voltage value detected by the evaluation circuit and the capacitance is determined from the final voltage value. The capacitance is determined from the final voltage value for example by looking it up in a table or by calculating it according to the aforementioned formula. It is essential for the invention that the evaluation circuit can detect the input voltage with the predetermined precision only in this measurement interval. If the input voltage is above or below the measurement interval, then the evaluation circuit should detect the input voltage only with the substantially lesser precision or should merely establish that it lies above the upper limit or below the lower limit of the measurement interval. Thus the crux of the invention is an evaluation circuit with a "magnifying glass function" such that the input voltage is no longer detected in the entire range of all possible input voltage values with approximately the same precision, but the precise detection of the input voltage is limited to a part-interval (measurement interval). With a relatively simple evaluation circuit this allows a relatively high precision of detection of the final voltage value.

The method according to the invention is particularly advantageous if it is not the absolute value of the capacitance but the relative change in capacitance which is to be detected. In this case it is not necessary to have either a precise knowledge of the resistance value or of the starting voltage nor an exact setting of a time interval; these values merely need to be kept constant from measurement to measurement. It is merely necessary to determine as precisely as possible the various final voltage values in the measurement interval. The starting voltage, the resistance value and the predetermined time period are then chosen so that the final voltage values for all values which might be expected for the changing capacitance lie within the measurement interval.

In a preferred embodiment of the method according to the invention the voltage across the capacitance is supplied to an input of an amplifier as a component of the evaluation circuit, whereby if the input voltage of the amplifier lies within the measurement interval it is amplified by at least the factor 2. Thus the final voltage value is amplified by at least the factor 2, and the amplified final voltage value is detected. In the case of input voltages above the measurement interval the amplifier is overridden, i.e. the output voltage of the amplifier takes on a maximum value (which is no longer dependent upon the concrete value of the input voltage). At this stage it should be pointed out that the expressions "above the measurement interval" or "maximum value" in the case of negative polarity can optionally be replaced by the equivalent expressions "below the measurement interval" and "minimum value" or that the expressions should be interpreted so that they are valid for the absolute values of the voltages. In the preferred embodiment the final voltage value is amplified for example by means of an operational amplifier by a factor between 10 and 1000, preferably between 10 and 50. For this purpose a relatively inexpensive operational amplifier is sufficient. In a preferred embodiment the amplified final voltage value is then detected, as a digital final value is generated by means of an analog/digital conversion and the generated digital final value is stored. In alternative embodiments, instead of the combination of an operational amplifier with an analog/digital converter it would also be possible to use an analog/digital converter with a non-linear sensitivity in such a way that it only converts voltages in the measurement interval with a high resolution, whilst voltage values outside the measurement interval are converted into digital values with a low resolution.

In an advantageous alternative embodiment of the invention the voltage across the capacitance is maintained for a second predetermined time period after the final voltage value is reached, whilst the final voltage value is recorded. This allows a relatively slow operational amplifier and analog/digital converter and further reduces the cost of the circuit.

In a preferred embodiment the charging to the starting voltage, the discharging via the resistance and the maintenance of the voltage by alternating connection and disconnection of a node connected to the connector of the capacitor is carried out with a voltage source or an earth potential, the connection and disconnection being carried out with the aid of switches which are controlled by a controller. The switches are preferably electronic switches and the controller preferably comprises a microprocessor or microcontroller.

In a preferred alternative embodiment the predetermined time period is determined by a processor (a microprocessor or microcontroller) as a function of a clock signal. The time constancy of this clock signal is achieved for example by use of a quartz oscillator for the clock signal generation. Thus the method according to the invention can be carried out with a relatively simple circuit arrangement which in addition to a few resistor components comprises an inexpensive operational amplifier and a microcontroller with an analog/digital converter input.

In a circuit arrangement according to the invention for measuring a capacitance of a capacitor a connector of the capacitor is connected to an input node of an evaluation circuit and the other connector of the capacitor is connected to a reference potential (for example earth potential). As already stated with regard to the method, the evaluation circuit is designed so that when an input voltage lies in a measurement interval the evaluation circuit detects it with a predetermined precision and generates a corresponding output value (the output value can for example be an output voltage or also an output digital value or code which corresponds the voltage). A first switch device can connect the input node to a constant voltage potential (for example the positive voltage supply potential which remains constant at least within the order of magnitude of several measurement intervals). A second switch device can connect a resistance of predetermined size (e.g. a precision resistance component) between the input node and the reference potential. A control device is connected to the first and the second switch device and controls the switch devices in such a way that (a) the input node is connected to the constant voltage potential, wherein the evaluation circuit generates an output value which assumes an extreme value (maximum value or minimum value) when the input node is at the constant voltage potential, (b) the resistance is then connected between the input node and the reference potential (for example earth) for a predetermined time period so that the voltage between the input node and the reference potential falls to a final value which lies in the measurement interval, and (c) the input node is then disconnected high-resistance) from the reference potential and the constant voltage potential in such a way that the voltage is maintained at the final value, where by the evaluation circuit generates an output value which is proportional to the final value. The output of the evaluation circuit is connected to a device for storing the output value and determining an appertaining capacitance value. This device may for example be a microcontroller.

The circuit arrangement is preferably characterised in that the evaluation circuit has an operational amplifier and an analog/digital converter connected to the output of the operational amplifier, wherein the analog/digital converter generates the output value. The input node can be connected to the inverting input of the operational amplifier. The operational amplifier has for example an amplification between 2 and 1000, preferably between 10 and 50.

In a preferred simple embodiment of the circuit arrangement the input node of the evaluation circuit is connected to an output connection of a controller (microcontroller) by way of a parallel connection of the resistance of predetermined size and a switching diode. The output connection of the controller may be at the reference potential (earth; low logical level) or the constant voltage potential (supply voltage, high logical level) or may be highly resistive. Thus in this embodiment the first switch device is formed by the switching diode and the controller and the second switch device is formed by the controller alone. The first switch device is "switched on", i.e. connects the input mode to the constant voltage potential when the output connection of the controller is at a high logical level and thus the switching diode is switched in the pass direction. The second switch device is "switched on" and connects the input node by way of the resistance to the reference potential (earth) when the output of the controller is at a low logical level (for example earth).

Advantageous and/or preferred alternative embodiments of the invention are characterised in the subordinate claims.

BRIEF DESCRIPTION OF THE DRAWINGS

The invention is explained in greater detail below with reference to a preferred embodiment which is illustrated in the drawings. In the drawings.

DETAILED DESCRIPTION

Figure 1:
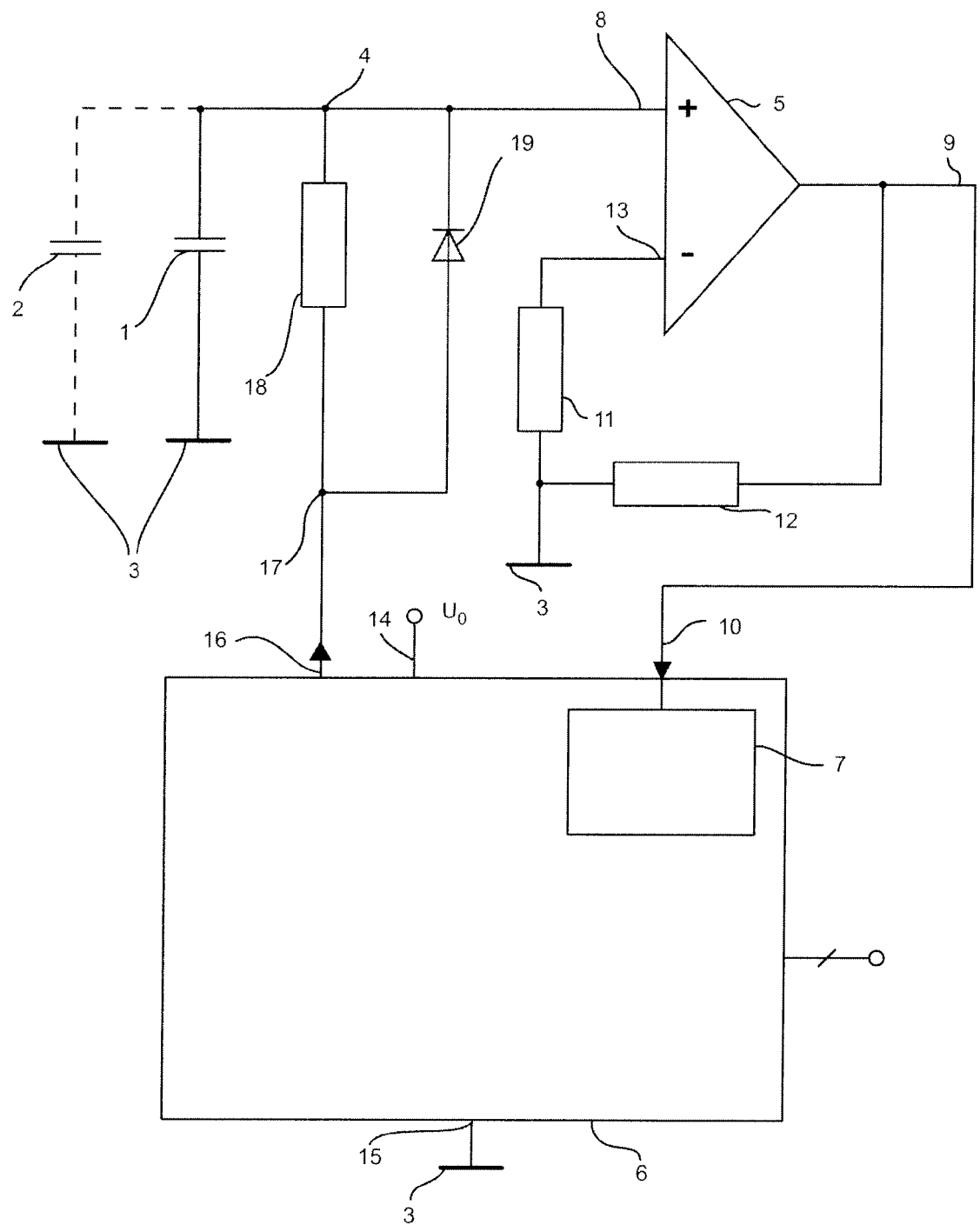
FIG. 1 shows a schematic circuit diagram of the circuit arrangement according to the invention.

FIG. 1 shows a schematic representation of a circuit arrangement according to the invention for determining a capacitance. The capacitance to be determined is made up of the sum of a switching capacitor 1 and an "interference capacitor" 2 (shown with supply lines indicated by broken lines in FIG. 1). In the preferred application of the circuit arrangement for a capacitive proximity sensor the switching capacitor 1 is a fixed component of the circuit arrangement and is designed so that its capacitance is as constant as possible under the environmental conditions to be expected. The capacitance 2 designated as "interference capacitor" is the capacitance which has an electrode of a capacitive proximity sensor relative to earth. This capacitance is dependent on the one hand upon the design and construction of the capacitive sensor (surface of the electrode, distance of the electrode from earth components, surround dielectric) and on the other hand upon the proximity and size of an object (for example the hand of a user) which is approaching the electrode and is connected to earth capacitively and/or resistively. The illustrated circuit arrangement serves principally to detect and monitor the changes to the capacitance 2 and to derive from these changes a statement concerning the proximity of the hand of a user. The design of an electrode arrangement of such a capacitive proximity sensor as well as the operation (for example when arranged in motor vehicle door handles) are known and do not need to be described in greater detail here.

As shown in FIG. 1, in each case a connector of the capacitances 1, 2 is connected to earth 3 as reference potential, whilst the other connector of the capacitor 1 or of the capacitance 2 is connected to an input node 4 of the circuit denoted as an evaluation circuit for determining the capacitance. In the embodiment illustrated in FIG. 1 the evaluation circuit is formed substantially by an operational amplifier 5 and an analog/digital converter 7 contained in a microcontroller 6. In this case the input node 4 is connected to the non-inverting input 8 of the operational amplifier 5. The output 9 of the operational amplifier is connected to an input connector 10 of the microcontroller 6, wherein the input connector 10 is connected to the input of the analog/digital converter 7. For setting the desired amplification the output 9 of the operational amplifier 5 is connected to the inverting input 13 of the operational amplifier 5 and earth 3 via a resistance network composed of the resistances 11 and 12. The amplification of the operational amplifier is set to a value between 10 and 50, so that the amount of the output voltage at the output 9 is 10 to 50 times the voltage on the input node 4. In addition to the analog/digital converter 7 the microcontroller 6 contains a number of further switching components which include a processor, a RAM, a ROM and further input and output circuits, such as for example analog/digital converter, digital/analog converter and driver circuits. The voltage supply of the microcontroller is represented symbolically by the connector 14 to which the voltage $U_0$ is applied. A connector 15 connected to earth 3 is also shown. Of course the microcontroller can have a series of further supply voltage and earth connectors and can also be supplied with several different supply voltages.

The microcontroller 6 has an output connector 16 which can assume three states. The voltage $U_0$ can be output there, it can be applied to earth and can be switched to be highly resistive (i.e. it can be disconnected from voltage potentials and earth). With the aid of the control output connector 16 the microcontroller 6 controls the measuring sequence described in greater detail below wherein at fixed predetermined times within a measuring sequence the potential of the output connector 16 is connected to the voltage $U_0$ or to earth or is switched to be highly resistive. The measuring sequences including the control of the output connector 16 and the processing of the output signals of the analog/digital converter 7 are controlled in a program contained in the microcontroller.

The output connector 16 is connected to a control node 17 of the measuring circuit which is in turn connected to the input node 4 by way of a parallel connection comprising a discharge resistor 18 and a switching diode 19. In this case the switching diode 19 is polarised so that it merely allows a current flow to pass through from the control node 17 to the input node 4. If the voltage $U_0$ is applied to the control node 17, then the parallel connection of the capacitances 1 and 2 is charged by way of the parallel connection of the resistance 18 and the switching diode 19, the resistance of which is substantially determined by the forward resistance of the switching diode 19, until the voltage on the input node 4 has reached $U_0$. This takes place relatively quickly due to the low forward resistance of the switching diode 19. When the current flow through the switching diode 19 is to be limited, a further resistance can be connected into the diode branch in series with the diode 19. Of course, this increases the charging time. If earth potential is applied to the control node 17 and the input node 4 is at a higher potential, for example at the voltage $U_0$ relative to earth, then the parallel connection of the capacitances 1 and 2 is discharged via the discharge resistor 18. Current flows via the switching diode 19 polarised in the reverse direction and via the inputs of the operational amplifier 5 are approximately equal to zero and thus can be disregarded. In the case of a resistance value R of the discharge resistance 18, a capacitance $C_1$ of the switching capacitor 1 and a capacitance $C_2$ of the interference capacitor 2, this gives a discharge time constant $\tau = R(C_1 + C_2)$.

If the control node 17 and the output connection 16 are switched to be highly resistive, then the voltage present at that time on the input node is approximately maintained. A slight drop in the voltage results from parasitic resistances between the input node 4 and earth, for example within the operational amplifier 5, within the output driver circuit of the output connector 16 and also across the capacitors 1 and 2 and other circuit elements.

For determining the capacitance $C_1 + C_2$ the microcontroller 6 controls the following measuring sequence. First of all the output connector 16 is connected to the voltage $U_0$. This voltage is stabilised and largely time constant. When the voltage $U_0$ is applied to the control node 17 the parallel connection of the capacitances $C_1 + C_2$ are quickly charged via the diode 19 to the voltage $U_0$ which is set after a short time on the input node 4. Then the output connection 16 is rapidly connected to earth potential. The capacitors 1 and 2 discharge via the discharge resistor 18 exponentially with the aforementioned time constant, resulting in the following voltage gradient on the input node 4:

$$U(t) = U_0 \cdot e^{-\frac{t}{R(C_1+C_2)}}.$$

The voltage $U_0$ applied to the inverting input 8 of the operational amplifier 5 is so high that the operational amplifier is overridden. It remains overridden until the voltage on the input node 4 has fallen exponentially to a value which corresponds to the upper limit of a measurement interval. When the non-inverting input 8 of the operational amplifier 5 is overridden the output 9 remains at a maximum voltage value. After a time period T predetermined by the program control of the microcontroller 6 the output connector 16 is switched to be highly resistive, so that the voltage present at this time on the input node 4 is substantially maintained (i.e. apart from parasitic discharges). Also the predetermined time period T is chosen so that the voltage present at the end of the time period on the input node 4 in the entire range of the changes in the capacitance 2 which may be expected lies in a measurement interval of the operational amplifier 5, but has not yet become almost zero. This mans that the time period T is chosen so that at the highest capacitance to be expected (for example when the user's hand is directly on the electrode of the capacitive sensor) the voltage has fallen just below the upper limit of the measurement interval, i.e. the operational amplifier is no longer overridden. On the other hand the time period T is not chosen to be too great in order to obtain a measurable voltage even at the lowest capacitance to be expected.

After the output connector 16 of the microcontroller 6 is switched to be highly resistive, the analog/digital converter 7 picks up the voltage on the output 9 of the operational amplifier. With the aforementioned set amplification values this voltage is approximately 10 to 50 times the voltage on the input node 4. With known amplification the voltage present on the input node 4 at the end of the time interval T can be determined from the digital value output by the analog/digital converter, and from this (with a knowledge of the voltage $U_0$ and the resistance R) the capacitance $C_1+C_2$ can be determined by the formula given in the introduction.

However, during practical use as proximity sensor the exact values of the amplification, the voltage $U_0$, the resistance R and the time interval T are not known and also of subordinate interest, since the microcontroller is merely intended to determine the relative (percentage) change in the capacitance $C_2$ over time. For this purpose the measuring sequence set out above is repeated cyclically a number of times. The digital values periodically output by the analog/digital converter are stored and processed, i.e. compared with one another, and the relative change in capacitance is calculated therefrom.

The relative changes in capacitance typically lie in the lower percent or per mile range. The changes to the measurement voltages which are set at the end of the time interval T on the input node 4 are also correspondingly small. The circuit arrangement according to the invention utilises the fact that only this voltage which is set at the end of the time interval T has to be measured precisely, but not all of the voltages produced during the measuring cycle on the input node 4. Starting from this, the voltage produced at the end of the interval T is greatly amplified (by the factor 10 to 50 or more) with the aid of the amplifier 5, and on the other hand it is accepted that the operational amplifier 5 optimised to the amplification of this range is overridden in the entire input voltage range lying above this. The conversion of the input node voltage into a voltage of the output 9, which is erroneous due to the overriding, is irrelevant for the measurement to be carried out. It is merely necessary to ensure that in the range of all changes in capacitance which might be expected the measurement voltage produced at the end of the interval T lies in the measurement interval of the operational amplifier 5. The precision of the measuring arrangement can be improved by the minimisation of parasitic current flows and the increase in the time constancy of the voltage $U_0$ and of the resistance R. This and an ideal behaviour of the operational amplifier 5 allow a relatively long discharge time T which leads to a relatively low voltage at the end of the time interval. Then a relatively small measurement interval is possible in an operational amplifier with a relatively great amplification. This increases the sensitivity of the measuring arrangement. However, the effects of noise should be influenced and interference fields should be screened out. The precision of measurement for the capacitance $C_2$ can also be increased by a reduction in the capacitance $C_1$ of the switching capacitor 1. On the other hand, due to this the circuit is more sensitive to disruptive influences.

Figure 2A:
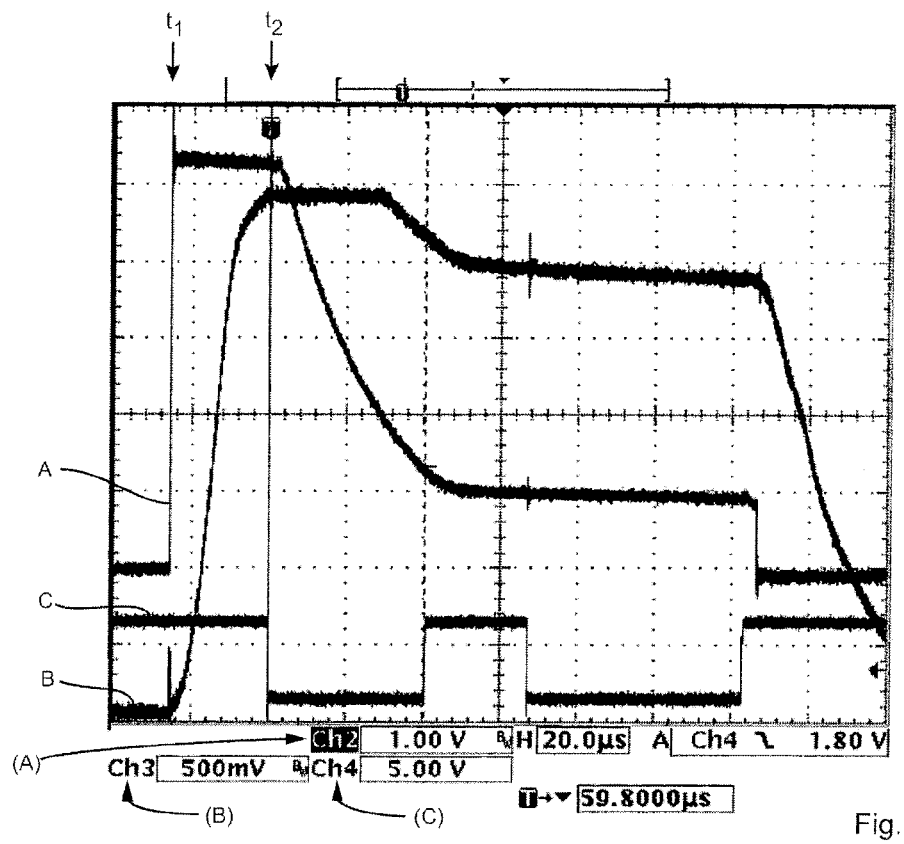
FIGS. 2A and 2B show examples of voltage gradients of the voltage across the capacitance and the voltage at the output of an operational amplifier.
Figure 2B:
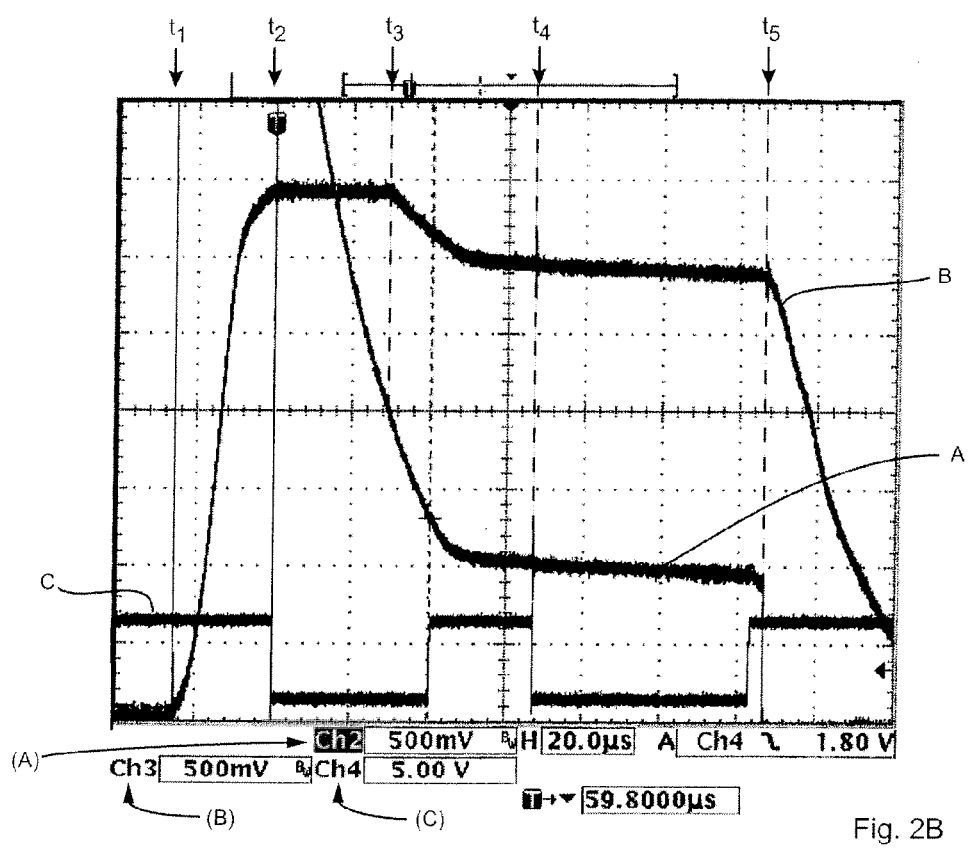

The voltage sequences on the input node 4 and at the output 9 which are produced in the above-mentioned measurement cycle are described in greater detail below with reference to FIGS. 2A and 2B. FIGS. 2A and 2B show experimentally recorded voltage sequences, wherein the sequences denoted by A represent the voltage on the input node 4, the sequences denoted by B represent the voltage at the output 9 of the operational amplifier, and the sequences denoted by C represent a binary test output signal of the microcontroller 6 for status information. FIG. 2B differs from FIG. 2A only in that in FIG. 2A a voltage scale has been chosen which allows a complete representation of the sequence A, whereas in FIG. 2B the same voltage scale has been chosen for the sequences A and B, the vertical space between two horizontal dotted lines corresponding in each case to the voltage value, and this scale can be seen from the channel information (Ch2, Ch3, Ch4) shown below the respective diagram. In FIG. 2A the height of a box formed by the dotted lines for the sequence A corresponds to a voltage of 1.00 V, for the sequence B it corresponds to a voltage of 500 mV and for the sequence C it corresponds to a voltage of 5.00 V. In FIG. 2B the height of a box for the sequences A and B corresponds to a voltage of 500 mV and for the sequence C it corresponds to a voltage of 5 V. In both figures the horizontal spacing between two vertical dotted lines corresponds to a time period of 20.0 µs.

The following voltage sequences can be seen from FIGS. 2A and 2B. At the time $t_1$ the output connection 16 of the microcontroller 6 is switched to the voltage $U_0$, whereupon the voltage on the input node 4 (sequence A) rises abruptly to a value of approximately 5.4 V, since the capacitor is charged via the switching diode 19 (at the resolution of FIGS. 2A and 2B) the transient oscillation of the node voltage is not perceptible). Whilst the voltage on the input node 4 is kept at the value $U_0$ the voltage at the output 9 of the operational amplifier (sequence B) follows this voltage rise until the saturation limit (the maximum value) of approximately 3.4 V is reached. The input voltage of 5.4 V overrides the operational amplifier. It can be seen in FIGS. 2A and 2B that the operational amplifier undergoes transient oscillation slowly (within approximately 20 µs). After the output signal of the operational amplifier has reached the maximum value the output 16 of the controller 6 is connected to earth abruptly at the time $t_2$, which is indicated by an abrupt drop in the status signal (sequence C). Thus the discharge of the capacitance begins at the time $t_2$; the voltage on the input node 4 (sequence A) drops exponentially. During the drop the voltage on the input node 4 at the time $t_3$ falls below the upper limit of the measurement interval; the operational amplifier is no longer overridden and from this time the output voltage (sequence B) follows the node voltage on the input node 4. In the examples illustrated in FIGS. 2A and 2B the voltage at the output 9 is approximately 3 times the input voltage. At the time 4 the output connection 616 of the microcontroller 6 is switched to be highly resistive, whereupon the voltage on the input node is substantially maintained, i.e. it only drops slightly. At the time $t_5$ the input node 4 is connected to earth so that the voltage drops abruptly to zero. It my be remarked here that the switching element with which the node 4 can be connected highly resistively to earth has not been illustrated in FIG. 1 for the sake of simplification. This switching element can also be omitted and the connector 16 can be discharged to earth. However, this would happen with the same time constant and the same exponential drop as can be seen in the time interval between $t_2$ and $t_4$.

In a measuring arrangement given by way of example a switching capacitor 1 of approximately 20 pF and a discharge resistance of approximately 560 kΩ has been used, resulting in a time constant τ of approximately 13 μs. Furthermore, in the estimation of the sensitivity of the measuring arrangement it has been assumed that the interference capacitor 2 has a capacitance of approximately 1% of the switching capacitor 1, that is to say approximately 0.2 pF. With a measurement time $T=\tau(=RC_1$—without interference capacitor) and a voltage of $U_0=5$ V this results in a measured voltage of 1.839 V without a interference capacitor and a voltage of 1.858 V with an interference capacitor. The difference of 19 mV amounts to approximately 1% of the measured voltage. With a measurement time of $T=2\tau$ and otherwise the same conditions this results in a measured voltage of 0.6766 V without an interference capacitor and 0.6902 V with an interference capacitor. The difference of 13.6 mV corresponds to approximately 2% of the voltage. With a measurement time of $T=3\tau$ this results in a voltage of 0.2489 V without an interference capacitor and a voltage of 0.2564 V with an interference capacitor. The difference of 7.5 mV amounts to approximately 3% of the voltage. Changes to the voltage in the region of a few percent can be dissipated well with an inexpensive analog/digital converter. A longer measurement time lads to a higher sensitivity of the measuring arrangement. However, the resulting lower voltages require more precise analog circuits.

Within the context of the idea underlying the invention alternative embodiments are conceivable. For example, the relevant capacitance does not need to be calculated from the digital starting value of the analog/digital converter, in order to increase the speed it can also be looked up in a lookup table, the lookup table being created on the basis of previously measured values. Moreover, in the detection of a relative change in capacitance it is not necessary to recalculate the output digital values of the analog/digital converter 7 and convert them directly into capacitance values; the voltage values can be directly compared and further processed. Moreover, additional switching elements can be included. For example, the connector of the capacitor 1 which is not connected to the input node 4 does not need to be connected to earth 3; for example a resistance can be connected in. As already stated, a resistance can also be connected in series with the diode 19.

The invention claimed is:

1. A circuit arrangement for measuring a capacitance of a capacitor, comprising:
   an evaluation circuit having an input node connected to a terminal of the capacitor, the other terminal of the capacitor being connected to a reference potential, the evaluation circuit detects an input voltage with a predetermined degree of precision only if the input voltage lies within a predetermined voltage measurement interval having an upper limit,
   a first switch device connecting the input node to a constant voltage potential,
   a second switch device coupling a resistor of predetermined size between the input node and the reference potential,
   a control device connected to the first and the second switch device controls the switch devices so that
   (a) first the input node is connected to the constant voltage potential, wherein the evaluation circuit generates an output value which assumes an extreme value when the input node is at the constant voltage potential,
   (b) the resistor is then connected between the input node and the reference potential for a predetermined time period so that the input voltage between the input node and the reference potential falls to a final value which lies in the predetermined voltage measurement interval, and
   (c) the input node is then disconnected from the reference potential and the constant voltage potential so that the input voltage is held at the final value, the evaluation circuit generating an output value which is proportional to the final value,
   the output of the evaluation circuit is connected to a device for storing the output value and determining an appertaining capacitance value.

2. The circuit arrangement as claimed in claim 1, wherein the evaluation circuit comprises an operational amplifier at its input and an analog/digital converter connected to the output of the operational amplifier, the analog/digital converter generating the output value.

3. The circuit arrangement as claimed in claim 2, wherein the input node is connected to the inverting input of the operational amplifier.

4. The circuit arrangement as claimed in claim 2, wherein the operational amplifier has an amplification between 2 and 1000.

5. The circuit arrangement as claimed in claim 1,
   wherein the input node of the evaluation circuit is connected to an output terminal of a controller by way of a parallel connection of the resistance of predetermined size and a switching diode,
   wherein the output terminal of the controller can be at the reference potential or the constant voltage potential or can be highly resistive,
   so that the first switch device is formed by the switching diode and the controller and the second switch device is formed by the controller alone.

6. The circuit arrangement as claimed in claim 5, wherein the reference potential corresponds to an earth potential and the constant voltage potential corresponds to a high logical output level of the controller.

7. The circuit arrangement as claimed in claim 2, wherein the operational amplifier has an amplification between 10 and 50.

8. A method of measuring a capacitance, comprising the steps of:
   a) coupling the capacitance to an input of an evaluation circuit so that a voltage across the capacitance is applied to said input, the evaluation circuit detects an input voltage with a predetermined degree of precision only if the input voltage lies within a predetermined voltage measurement interval having an upper limit;
   b) charging the capacitance to a predetermined starting voltage which exceeds a multiple of the upper limit of the predetermined voltage measurement interval;
   c) discharging the capacitance across a predetermined resistance for a predetermined time period so that the voltage across the capacitance reaches a final voltage value, the predetermined resistance and the predetermined time period being chosen so that the final voltage value lies within the predetermined voltage measurement interval; and
   d) detecting the final voltage value by the evaluation circuit and determining the capacitance from the final voltage value.

9. The method as claimed in claim 8, wherein the step of coupling comprises coupling the capacitance to the input of the evaluation circuit having an amplifier at its input, so that the voltage across the capacitance is applied to the amplifier, the amplifier amplifying the voltage across the capacitance by at least the factor of 2 if the voltage across the capacitance lies within the predetermined voltage measurement interval, and the amplifier being overridden if the voltage across the capacitance is above the predetermined voltage measurement interval.

10. The method as claimed in claim 9, wherein the input voltage of the amplifier is amplified by a factor between 2 and 1000 if the voltage across the capacitance lies within the predetermined voltage measurement interval.

11. The method as claimed in claim 9, wherein the step of detecting the final voltage value comprises generating a digital final value from the final voltage value by means of an analog/digital conversion and storing the generated digital final value.

12. The method as claimed in claim 8, comprising after the discharging step the step of holding the voltage across the capacitance for a second predetermined time period after the final voltage value is reached, whilst the final voltage value is detected.

13. The method as claimed in claim 12, wherein the steps of charging the capacitance to the predetermined starting voltage, discharging the capacitance across the predetermined resistance and holding the voltage are carried out by alternately connecting and disconnecting a node connected to a terminal of the capacitor with a voltage source or an earth potential, the connecting and disconnecting being carried out with the aid of switches which are controlled by a controller.

14. The method as claimed in claim 8, wherein the step of charging comprises providing the predetermined starting voltage by a constant voltage source.

15. The method as claimed in claim 8, wherein the step of discharging the capacitance across a predetermined resistance for a predetermined time period comprises determining the predetermined time period by a processor as a function of a clock signal.

\* \* \* \* \*